(12) United States Patent
Cho et al.

(10) Patent No.: US 11,164,981 B2
(45) Date of Patent: Nov. 2, 2021

(54) METHOD FOR FORMING A PASSIVATING ELECTRICAL CONTACT ON A CRYSTALLINE SEMICONDUCTOR SUBSTRATE AND DEVICE COMPRISING SUCH CONTACT

(71) Applicants: IMEC VZW, Leuven (BE); Katholieke Universiteit Leuven, KU LEUVEN R&D, Leuven (BE)

(72) Inventors: Jinyoun Cho, Kessel-Lo (BE); Maria Jesus Recaman Payo, Attenrode (BE); Maarten Debucquoy, Kessel-Lo (BE); Jef Poortmans, Kessel-Lo (BE)

(73) Assignees: IMEC VZW, Leuven (BE); KATHOLIEKE UNIVERSITEIT, KU LEUVEN R&D, Leuven (BE)

( * ) Notice: Subject to any disclaimer, the term of this patent is extended or adjusted under 35 U.S.C. 154(b) by 0 days.

(21) Appl. No.: 16/786,554

(22) Filed: Feb. 10, 2020

(65) Prior Publication Data

US 2020/0259025 A1 Aug. 13, 2020

(30) Foreign Application Priority Data

Feb. 11, 2019 (EP) .................................... 19156414

(51) Int. Cl.
*H01L 31/0224* (2006.01)
*H01L 31/028* (2006.01)
*H01L 31/18* (2006.01)

(52) U.S. Cl.
CPC .... *H01L 31/022466* (2013.01); *H01L 31/028* (2013.01); *H01L 31/1864* (2013.01); *H01L 31/1868* (2013.01); *H01L 31/1884* (2013.01)

(58) Field of Classification Search
CPC .......... H01L 31/022466; H01L 31/028; H01L 31/1864; H01L 31/1868; H01L 31/1884; H01L 31/06; H01L 31/02245; H01L 31/02167; H01L 31/1804; H01L 31/1808; H01L 31/022425; Y02E 10/547
See application file for complete search history.

(56) References Cited

U.S. PATENT DOCUMENTS

2016/0380131 A1* 12/2016 Crafts ............... H01L 31/03529 438/71
2020/0259025 A1* 8/2020 Cho .................. H01L 31/02167

OTHER PUBLICATIONS

Huang et al., Top-Gate Amorphous Silicon TFT With Self-Aligned Silicide Source/Drain and High Mobility, IEEE Electron Device Letters, vol. 29, No. 7, Jul. 2008, pp. 737-739 (Year: 2008).*

(Continued)

*Primary Examiner* — Earl N Taylor
(74) *Attorney, Agent, or Firm* — McDonnell Boehnen Hulbert & Berghoff LLP

(57) ABSTRACT

A method includes depositing a first layer including amorphous silicon on a surface of a substrate; depositing a second layer including metal on the first layer; and performing an annealing process at a temperature within a range of 70° C. to 200° C., thereby inducing a silicidation reaction between the first layer and the second layer and forming a third layer comprising a metal silicide in electrical contact with the substrate, resulting in a remaining part of the first layer being between the substrate and the third layer.

20 Claims, 12 Drawing Sheets

(56) References Cited

OTHER PUBLICATIONS

Woo Kim et al., Investigation on Suppression of Nickel-Silicide Formation By Fluorocarbon Reactive Ion Etch (RIE) and Plasma-Enhanced Deposition, Journal of Semiconductor Technology and Science, vol. 13, No. 1, Feb. 2013, 7 pages (Year: 2013).*

Caputo et al., Characterization of chromium silicide thin layer formed on amorphous silicon films, Journal of Non-Crystalline Solids, 354, 2008, pp. 2171-2175 (Year: 2008).*

Tucci, Mario, Luca Serenelli, Enrico Salza, Luisa Pirozzi, Giampiero De Cesare, Domenico Caputo, Matteo Ceccarelli, Pierino Martufi, Simona De Iuliis, and Lambert J. Geerligs. "B ack E nhanced H eterostructure with I N terDigitated contact-BEHIND-solar cell." In 2008 Conference on Optoelectronic and Microelectronic Materials and Devices, pp. 242-245. IEEE, 2008.

Posthuma, N. E., J. Van der Heide, G. Flamand, and J. Poortmans. "Recent progress in the development of a stand-alone germanium solar cell." Proc. 21st EUPVSEC, Dresden (2006): 137-40.

European Search Report, European Patent Application No. 19156414.5, dated Jun. 7, 2019, 7 pages.

* cited by examiner

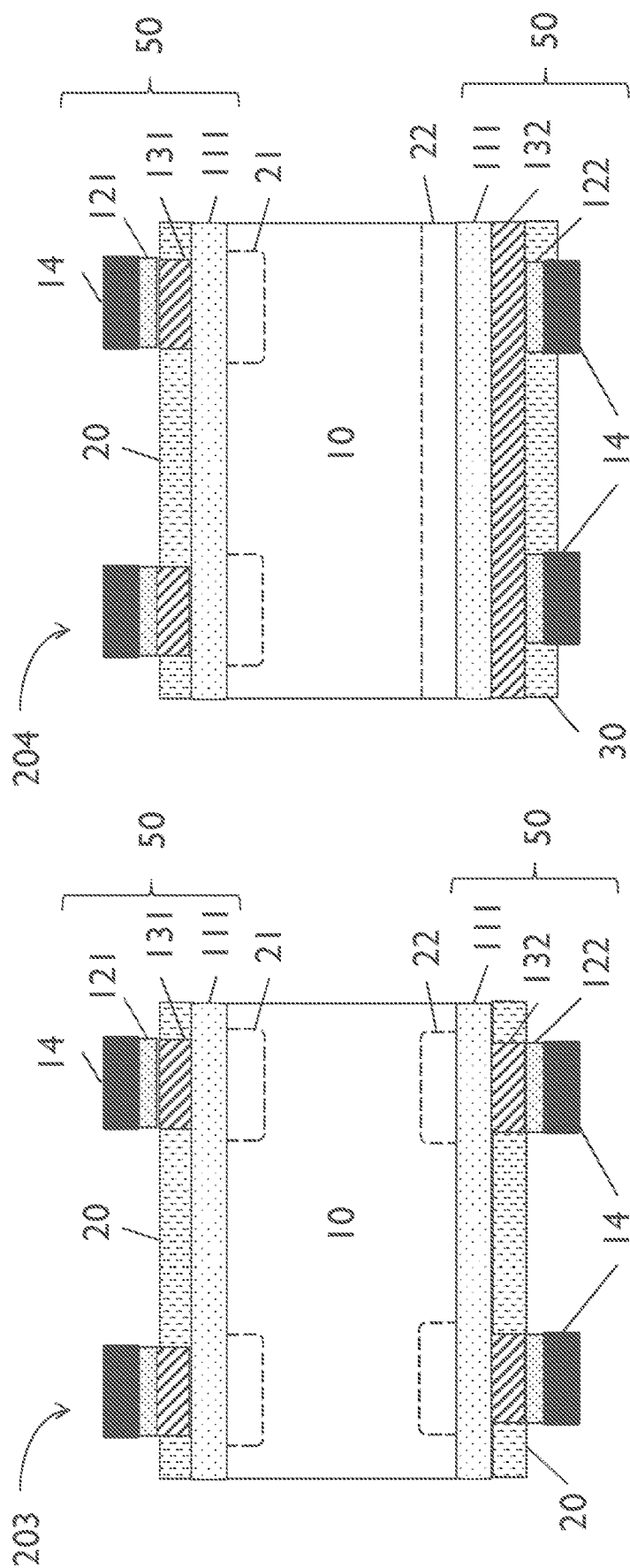

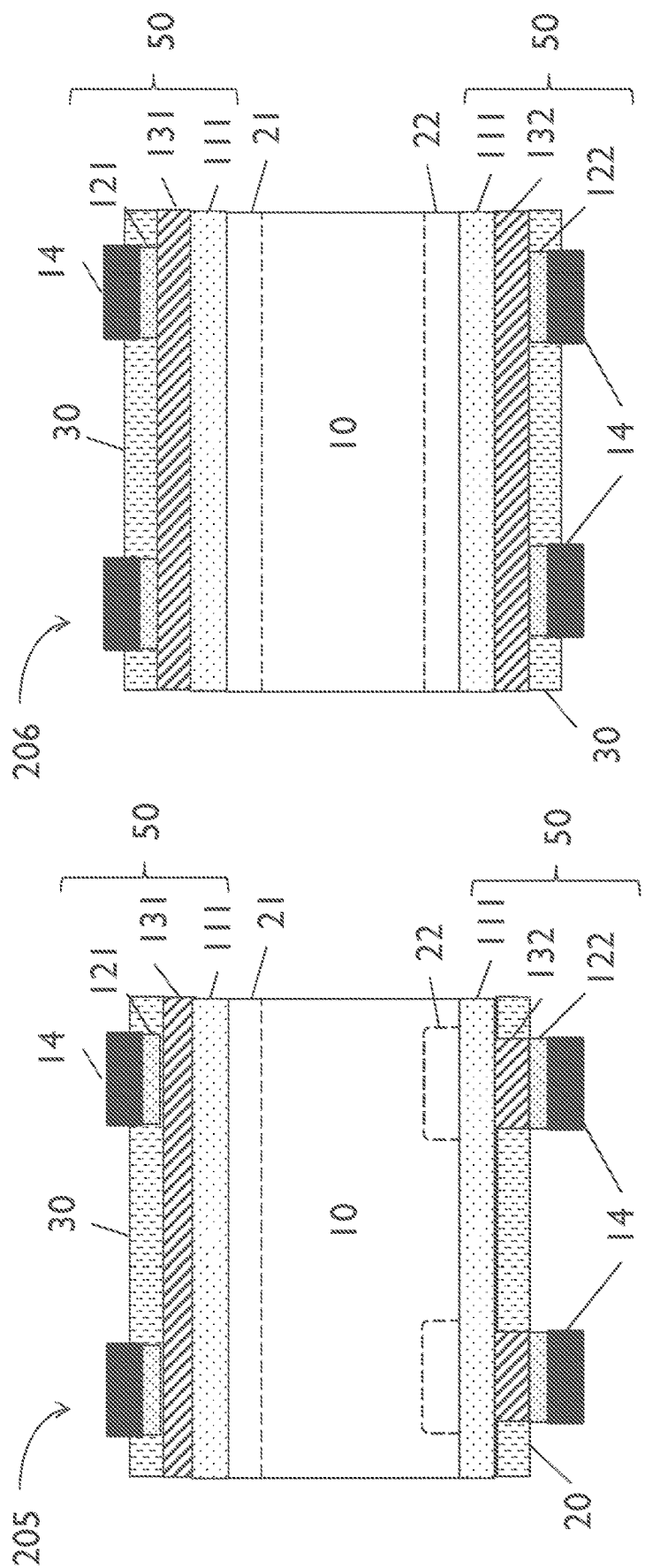

METHOD FOR FORMING A PASSIVATING ELECTRICAL CONTACT ON A CRYSTALLINE SEMICONDUCTOR SUBSTRATE AND DEVICE COMPRISING SUCH CONTACT

CROSS-REFERENCE TO RELATED APPLICATIONS

The present application is a non-provisional patent application claiming priority to European Patent Application No. 19156414.5 filed on Feb. 11, 2019, the contents of which are hereby incorporated by reference.

FIELD OF THE DISCLOSURE

The present disclosure relates to methods for forming a passivating electrical contact on a crystalline semiconductor substrate, such as a crystalline silicon substrate or a crystalline germanium substrate, and to devices, such as photovoltaic cells, comprising such a passivating electrical contact.

BACKGROUND

Passivating electrical contacts for forming an electrical contact on a semiconductor layer or to a semiconductor substrate are known, for example, in the context of photovoltaic cells. Passivating electrical contacts provide surface passivation of the underlying semiconductor substrate and charge carrier selectivity of the electrical contact.

For example, a passivating electrical contact may comprise a stack of an undoped (intrinsic) a-Si:H layer, a doped a-Si:H layer on top of the undoped a-Si:H layer, and an electrically conductive layer such as a metal layer or a conductive oxide layer on top of the doped a-Si:H layer. The intrinsic a-Si:H layer is provided on the semiconductor surface to provide surface passivation, the doped a-Si:H layer provides charge carrier selectivity, and the electrically conductive layer provides a low resistivity electrode at the contact thus formed. It can be a disadvantage of this type of passivating electrical contacts that they may cause substantial optical absorption losses, mainly due to the presence of a stack of two a-Si:H layers, comprising a doped a-Si:H layer in addition to the intrinsic a-Si:H passivation layer. Such optical absorption losses are to be avoided or minimized, in particular when the passivating electrical contacts are used for contacting photovoltaic cells.

Another example of a passivating electrical contact is a structure comprising a stack of a thin (e.g. 1 nm thin) silicon oxide layer, a doped polysilicon layer on the thin silicon oxide layer and an electrically conductive layer such as a metal layer or a conductive oxide layer on the doped polysilicon layer. This type of passivating electrical contacts is thermally more stable than a-Si based passivating electrical contacts, but it can have the same disadvantage of causing substantial optical absorption losses, mainly due to the presence of the doped polysilicon layer, which is to be avoided or minimized when used for contacting photovoltaic cells.

Another approach for forming passivating electrical contacts is based on the use of a transition metal oxide. Such transition metal oxides may be optically transparent. For example, an electron-selective contact may be formed on a crystalline silicon substrate with materials that have a work function of 4.1 eV or less, such as $TiO_x$. Materials that have a work function of 5.2 eV or more, such as $MoO_x$, $VO_x$, and $WO_x$, are potential hole-selective contacts on crystalline silicon. A transition metal oxide based passivating electrical contact may comprise a stack of a thin passivating layer such as an undoped (intrinsic) a-Si:H layer or a silicon oxide layer, a (transparent) transition metal oxide layer on top of the passivating layer and an electrically conductive layer such as a metal layer or a conductive oxide layer on top of the transition metal oxide layer. It can be a disadvantage of this type of passivating electrical contacts that the thermal stability of the transition metal oxide is weak, leading to a significant increase of the contact resistivity after annealing.

Further, transparent conductive oxides (TCO) such as for example ITO (Indium Tin Oxide) may be used for forming passivating electrical contacts. A TCO based passivating electrical contact may for example comprise a stack of a thin silicon oxide layer, a transparent conductive oxide layer on top of the thin silicon oxide layer and a metal layer on top of the transparent conductive oxide layer. This type of passivating electrical contacts may have a sufficiently low contact resistivity (for example on the order of 12 $mOhm \cdot cm^2$), but the recombination current density in the contact area is relatively high (for example around 100 $fA/cm^2$).

Hence, there is a need for passivating electrical contacts that simultaneously have a good thermal stability, low optical absorption losses, a low contact resistivity, and a low recombination current density in the contact area.

SUMMARY

It is a potential benefit of the present disclosure to provide passivating electrical contacts on a crystalline semiconductor substrate, the passivating electrical contacts having a low contact resistivity, for example a contact resistivity or specific contact resistance less than 0.1 Ohm $cm^2$, and providing a low recombination current density in the contact area, for example less than 25 $fA/cm^2$ or for example less than 10 $fA/cm^2$. It is another potential benefit of the present disclosure to provide methods for forming such passivating electrical contacts.

It is a potential benefit of the present disclosure to provide passivating electrical contacts on a crystalline semiconductor substrate, the passivating electrical contacts having a low contact resistivity and providing a low recombination current density in the contact area, without the need for providing a doped layer as part of the contact and with a reduced doping level of the underlying semiconductor layer in the contact area (such as for example a doping level less than $10^{18}$ $cm^{-3}$) or without the need for providing a doped layer in the underlying semiconductor layer in the contact area. It is another potential benefit of the present disclosure to provide methods for forming such passivating electrical contacts.

It is a potential benefit of the present disclosure to provide passivating electrical contacts with a good thermal stability, i.e. passivating electrical contacts that substantially maintain their initial low contact resistivity and low recombination current density in the contact area when exposed to thermal influences. It is a potential benefit of the present disclosure to provide such passivating electrical contacts with limited optical absorption losses, for example with less than 10%, for example less than 5% of incident light being absorbed in the passivating electrical contacts. It is another potential benefit of the present disclosure to provide methods for forming such passivating electrical contacts with good thermal stability and limited optical absorption losses.

The above potential benefits can be at least partially accomplished by a method and device according to the present disclosure.

According to a first aspect the disclosure is related to a method for forming a passivating electrical contact on a crystalline semiconductor substrate.

A method for forming a passivating electrical contact on a crystalline semiconductor substrate is provided, the method comprising depositing an initial intrinsic amorphous silicon-containing layer on a surface of the crystalline silicon substrate; depositing a first metal layer on the initial intrinsic amorphous silicon-containing layer; and performing an annealing process at a temperature in the range between 70° C. and 200° C., thereby inducing a silicidation reaction between at least part of the first metal layer and part of the initial intrinsic amorphous silicon-containing layer and forming a metal silicide layer in electrical contact with the crystalline semiconductor substrate. After having formed the passivating electrical contact, a part of the intrinsic amorphous silicon layer remains as a passivation layer in between the crystalline semiconductor substrate and the metal silicide layer. This remaining part of the intrinsic amorphous silicon layer is a part that did not participate in the silicidation reaction with the first metal layer.

In embodiments of a method of the present disclosure the first metal of the first metal layer is selected considering its silicidation temperature, i.e. a first metal with a silicidation temperature (temperature of the annealing step or sintering step) in the range between 70° C. and 200° C. is selected.

In embodiments, only part of the first metal layer participates in the silicidation reaction. In such embodiments, after having formed the metal silicide layer, a part of the first metal layer remains on top of the metal silicide layer. In other embodiments, the entire first metal layer may participate in the silicidation reaction such that, after having formed the metal silicide layer, no part of the first metal layer remains.

The crystalline semiconductor substrate may for example be a crystalline silicon substrate, a crystalline germanium substrate, or a crystalline III-V semiconductor substrate.

It can be an advantage of embodiments of the method of the present disclosure that it may form a passivating, charge carrier selective electrical contact simultaneously resulting in a sufficiently low recombination current density in the contact areas, for example less than 25 fA/cm$^2$, for example less than 10 fA/cm$^2$, and a sufficiently low contact resistivity, for example less than 0.1 Ohm cm$^2$, without the need for providing a doped layer such as a doped a-Si:H layer or a doped polysilicon layer as part of the contact (thereby avoiding undesired absorption losses). For example, when the method of the present disclosure is used for forming passivating electrical contacts to a crystalline photovoltaic cell, the reduced recombination current in the contact area may result in an increased open-circuit voltage and the reduced contact resistivity may result in a reduced series resistance and thus an improved fill factor of the cell. Both effects lead to an enhanced photovoltaic cell efficiency. It can be an advantage of embodiments of the present disclosure that a good contact resistivity may be obtained without the need for forming a highly doped region in the crystalline semiconductor substrate underneath the electrical contact, thereby substantially avoiding minority carrier recombination losses such as Auger recombination losses in the substrate.

In embodiments of the method of the present disclosure, it can be an advantage of performing the annealing step inducing the silicidation reaction between at least part of the first metal layer and part of the initial intrinsic amorphous silicon-containing layer at a temperature less than 200° C. that it can substantially limit undesired thermal effects on the quality of the passivating electrical contact. For example, performing the annealing step at a temperature less than 200° C. allows maintaining a good passivation quality of the passivating electrical contact. It can further allow obtaining a low contact resistivity.

In a method for forming a passivating electrical contact on a crystalline semiconductor substrate according to the present disclosure, the initial intrinsic amorphous silicon-containing layer may be either a single layer or it may be a stack of at least two, for example two different, intrinsic amorphous silicon-containing layers. The initial intrinsic amorphous silicon-containing layer may comprise a material selected from amorphous silicon (a-Si), amorphous silicon oxide (a-SiO$_x$), carbon containing amorphous silicon oxide (a-SiO$_x$(C)), carbon containing amorphous silicon (a-Si(C)), amorphous silicon carbide (a-SiC$_x$), amorphous silicon nitride (a-SiN$_x$), amorphous silicon oxynitride (a-SiO$_x$N$_y$) or a combination thereof.

The intrinsic amorphous silicon-containing layer may be a hydrogenated layer, which can be advantageous in that it may provide an improved surface passivation to the underlying crystalline semiconductor substrate.

In embodiments of the present disclosure the first metal layer may comprise a transition metal, a rare earth metal, an alkaline earth metal or a combination thereof. For example, the first metal layer may comprise a metal selected from nickel (Ni), rhodium (Rh), ruthenium (Ru), platinum (Pt), rhenium (Re), palladium (Pd), vanadium (V), cobalt (Co), osmium (Os), tungsten (W), iridium (Ir), ytterbium (Yb), yttrium (Y), gadolinium (Gd), dysprosium (Dy), holmium (Ho), erbium (Er), thulium (Tm), europium (Eu), samarium (Sm), neodymium (Nd), cerium (Ce), lanthanum (La), magnesium (Mg), barium (Ba) and strontium (Sr), or a combination thereof.

In a method according to the first aspect of the present disclosure, at least one second metal layer may be deposited over the first metal layer before performing the annealing process, which can be advantageous in that the presence of the second metal layer may avoid undesired oxidation of the first metal layer. Such undesired oxidation may result from an oxidation reaction between the first metal layer and the annealing environment used during the annealing process, especially when such an annealing process is performed in an oxygen containing atmosphere. In embodiments wherein the annealing process is performed in a non-oxidizing atmosphere such as in a nitrogen atmosphere or in an argon atmosphere, there may be no need for providing a second metal layer over the first metal layer before performing the annealing process. In such embodiments an additional metal layer (second metal layer) may be provided on the passivating electrical contact to improve the electrical conductivity of an electrode formed at the contact and/or to facilitate electrical (inter)connections. Such additional metal layer may either be provided before performing the annealing step or after performing the annealing step.

In embodiments of the present disclosure the first metal of the first metal layer may be selected to form a metal silicide that induces an inversion region in the underlying crystalline semiconductor substrate. This can be advantageous in that the method for forming the passivating electrical contact may simultaneously form a p-n junction in the underlying semiconductor substrate, such that the need for performing a dedicated step such as a thermal diffusion step or an ion implantation step for forming a p-n junction may be avoided.

For example, such a p-n junction may form an emitter region in a photovoltaic cell. Therefore, the method of the present disclosure may result in a reduction of the number of process steps to be performed for fabricating a semiconductor device, and more in particular a reduction of the number of process steps to be performed at elevated temperatures, such as for example temperatures higher than 600° C. or higher than 800° C. This may result in a process simplification, a reduced process cost, and an increased throughput.

In embodiments of the present disclosure the first metal of the first metal layer may be selected to form a metal silicide that induces an accumulation region in the underlying crystalline semiconductor substrate. This can be advantageous in that the method for forming the passivating electrical contact may simultaneously form a high/low junction (p+/p or n+/n) in the underlying semiconductor substrate, such that the need for performing a dedicated step such as a thermal diffusion step or an implantation step for forming such a high/low junction may be avoided. For example, such a high/low junction may form a Back-Surface Field region or a Front Surface Field region in a photovoltaic cell. The method of the present disclosure may thus result in a reduction of the number of process steps to be performed for fabricating a semiconductor device, and more in particular a reduction of the number of process steps to be performed at elevated temperatures, such as for example temperatures higher than 600° C. or higher than 800° C. This may result in a process simplification, a reduced process cost, and an increased throughput.

Selecting the first metal to form a metal silicide that induces an inversion region in the underlying crystalline semiconductor substrate or selecting the first metal to form a metal silicide that induces an accumulation region in the underlying crystalline semiconductor substrate can comprise selecting a first metal for the first metal layer that results in a metal silicide layer comprising a metal silicide with an appropriate work function (after having performed the annealing process to induce the silicidation reaction). For example, a metal silicide having a work function that is sufficiently high as compared to the work function of the underlying crystalline semiconductor material may induce a p-type region in the crystalline semiconductor substrate. When the crystalline semiconductor substrate is a p-type substrate, such induced p-type region may form an accumulation region in the crystalline semiconductor substrate. When the crystalline semiconductor substrate is an n-type substrate, such induced p-type region may form an inversion region in the crystalline semiconductor substrate. For example, when the crystalline semiconductor substrate is a crystalline silicon substrate, a metal silicide with a work function higher than 5 eV, for example higher than 5.2 eV, may be selected to induce a p-type region. For example, a metal silicide having a work function that is sufficiently low as compared to the work function of the underlying crystalline semiconductor material may induce an n-type region in the crystalline semiconductor substrate. When the crystalline semiconductor substrate is a p-type substrate, such induced n-type region may form an inversion region in the crystalline semiconductor substrate. When the crystalline semiconductor substrate is an n-type substrate, such induced n-type region may form an accumulation region in the crystalline semiconductor substrate. For example, when the crystalline semiconductor substrate is a crystalline silicon substrate, a metal silicide with a work function less than 4.1 eV, for example less than 3.5 eV, may be selected to induce an n-type region.

According to a second aspect the disclosure is related to a crystalline semiconductor device comprising a crystalline semiconductor substrate and at least one passivating electrical contact on the crystalline semiconductor substrate.

In general, features of this aspect of the present disclosure can provide similar advantages as discussed above in relation to the first aspect of the disclosure.

A crystalline semiconductor device is provided, the crystalline semiconductor device comprising a crystalline semiconductor substrate and at least one passivating electrical contact on the crystalline semiconductor substrate, wherein the at least one passivating electrical contact comprises a stack of an intrinsic amorphous silicon-containing layer on the crystalline semiconductor substrate and a metal silicide layer on the intrinsic amorphous silicon-containing layer.

In a crystalline semiconductor device of the present disclosure, the at least one passivating electrical contact may further comprise at least one second metal layer above the metal silicide layer. In embodiments of the disclosure the second metal layer may be present directly on the metal silicide layer. In other embodiments another layer, such as a first metal layer, may be present between the metal silicide layer and the second metal layer. The first metal layer comprises the same metal as the metal silicide layer.

It can be an advantage of the crystalline semiconductor device of the present disclosure that the electrical contact may be a passivating, charge carrier selective electrical contact resulting in a reduced recombination current and a reduced contact resistivity. For example, when the crystalline semiconductor device is a crystalline photovoltaic cell, the reduced recombination current may result in an increased open-circuit voltage and the reduced contact resistivity may result in a reduced series resistance and thus an improved fill factor of the cell. Both effects lead to an enhanced photovoltaic cell efficiency. It can be an advantage of embodiments of the present disclosure that a good contact resistivity may be obtained without the need for having a highly doped region in the crystalline semiconductor substrate underneath the passivating electrical contact.

The intrinsic amorphous silicon-containing layer may be either a single layer or it may be a stack of at least two, for example two different, intrinsic amorphous silicon-containing layers. The intrinsic amorphous silicon-containing layer may for example comprise a material selected from amorphous silicon (a-Si), amorphous silicon oxide (a-SiO$_x$), carbon containing amorphous silicon oxide (a-SiO$_x$(C)), carbon containing amorphous silicon (a-Si(C)), amorphous silicon carbide (a-SiC$_x$), amorphous silicon nitride (a-SiN$_x$), amorphous silicon oxynitride (a-SiO$_x$N$_y$) or a combination thereof.

The intrinsic amorphous silicon-containing layer may be a hydrogenated layer, which can be advantageous in that it may provide an improved surface passivation to the underlying crystalline semiconductor substrate.

In embodiments of the present disclosure the first metal layer may comprises a transition metal, a rare earth metal, an alkaline earth metal or a combination thereof. For example, the first metal layer may comprise a metal selected from nickel (Ni), rhodium (Rh), ruthenium (Ru), platinum (Pt), rhenium (Re), palladium (Pd), vanadium (V), cobalt (Co), osmium (Os), tungsten (W), iridium (Ir), ytterbium (Yb), yttrium (Y), gadolinium (Gd), dysprosium (Dy), holmium (Ho), erbium (Er), thulium (Tm), europium (Eu), samarium (Sm), neodymium (Nd), cerium (Ce), lanthanum (La), magnesium (Mg), barium (Ba) and strontium (Sr), or a combination thereof.

The crystalline semiconductor device according to the second aspect of the disclosure may further comprise an inversion region in the crystalline semiconductor substrate underneath the at least one passivating electrical contact. This inversion region may be induced by the at least one passivating electrical contact.

The crystalline semiconductor device according to the second aspect of the disclosure may further comprise an accumulation region in the crystalline semiconductor substrate underneath the at least one passivating electrical contact. This accumulation region may be induced by the at least one passivating electrical contact.

The crystalline semiconductor device according to the second aspect of the present disclosure may for example be a crystalline photovoltaic cell, such as for example a crystalline silicon photovoltaic cell. It can be an advantage of a crystalline photovoltaic cell according to the second aspect of the disclosure that it may have a good long-term stability, for example an improved long-term stability as compared to transition metal oxide based passivating electrical contacts. For example, a photovoltaic module comprising crystalline photovoltaic cells in accordance with the second aspect of the present disclosure may be subject to a reduction in power output of less than 10%, for example less than 5%, after 1000 hours of exposure to a damp heat test performed according to the IEC61215 standard.

Aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features, and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

FIG. 9 schematically illustrates examples of different embodiments of crystalline silicon photovoltaic cells, according to an example embodiment.

FIG. 10 schematically illustrates examples of different embodiments of crystalline silicon photovoltaic cells, according to an example embodiment.

FIG. 11 schematically illustrates examples of different embodiments of crystalline silicon photovoltaic cells, according to an example embodiment.

FIG. 12 schematically illustrates examples of different embodiments of crystalline silicon photovoltaic cells, according to an example embodiment.

Figure 1:
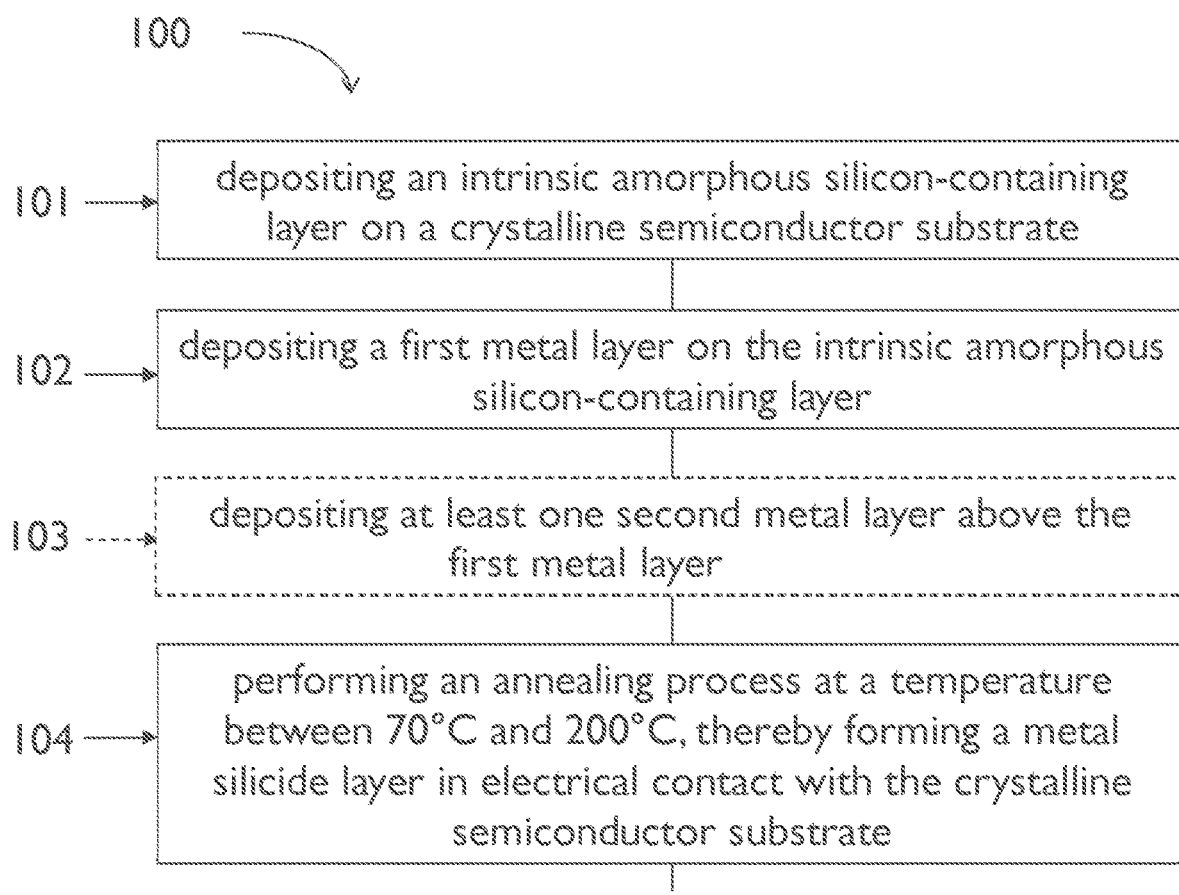
FIG. 1 schematically illustrates a process flow, according to an example embodiment.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

In some embodiments of the present disclosure, the front surface or front side of a photovoltaic cell or of a photovoltaic module is the surface or side adapted for being oriented towards a light source and thus for receiving illumination. In the case of bifacial photovoltaic cells or modules, both surfaces are adapted to receive impinging light. In this case, the front surface or front side is the surface or side adapted for receiving the largest fraction of the light or illumination. The back surface, rear surface, back side, or rear side of a photovoltaic cell or a photovoltaic module is the surface or side opposite to the front surface or side.

Within examples, passivating electrical contacts comprise a stack of an intrinsic amorphous silicon-containing passivation layer and a metal silicide layer. The passivating electrical contacts may further comprise at least one metal layer on the metal silicide layer. In the context of the present disclosure, a passivating electrical contact is referred to as a non-patterned contact or a full area contact when the metal silicide layer is non-patterned. If such non-patterned passivating electrical contact further comprises a metal layer, the metal layer may either be patterned or non-patterned. In the context of the present disclosure, a passivating electrical contact is referred to as a patterned contact or a local contact when the metal silicide layer is patterned. If such patterned contact further comprises a metal layer, also the metal layer is a patterned layer, for example patterned according to substantially the same pattern as the metal silicide layer.

Figure 2:
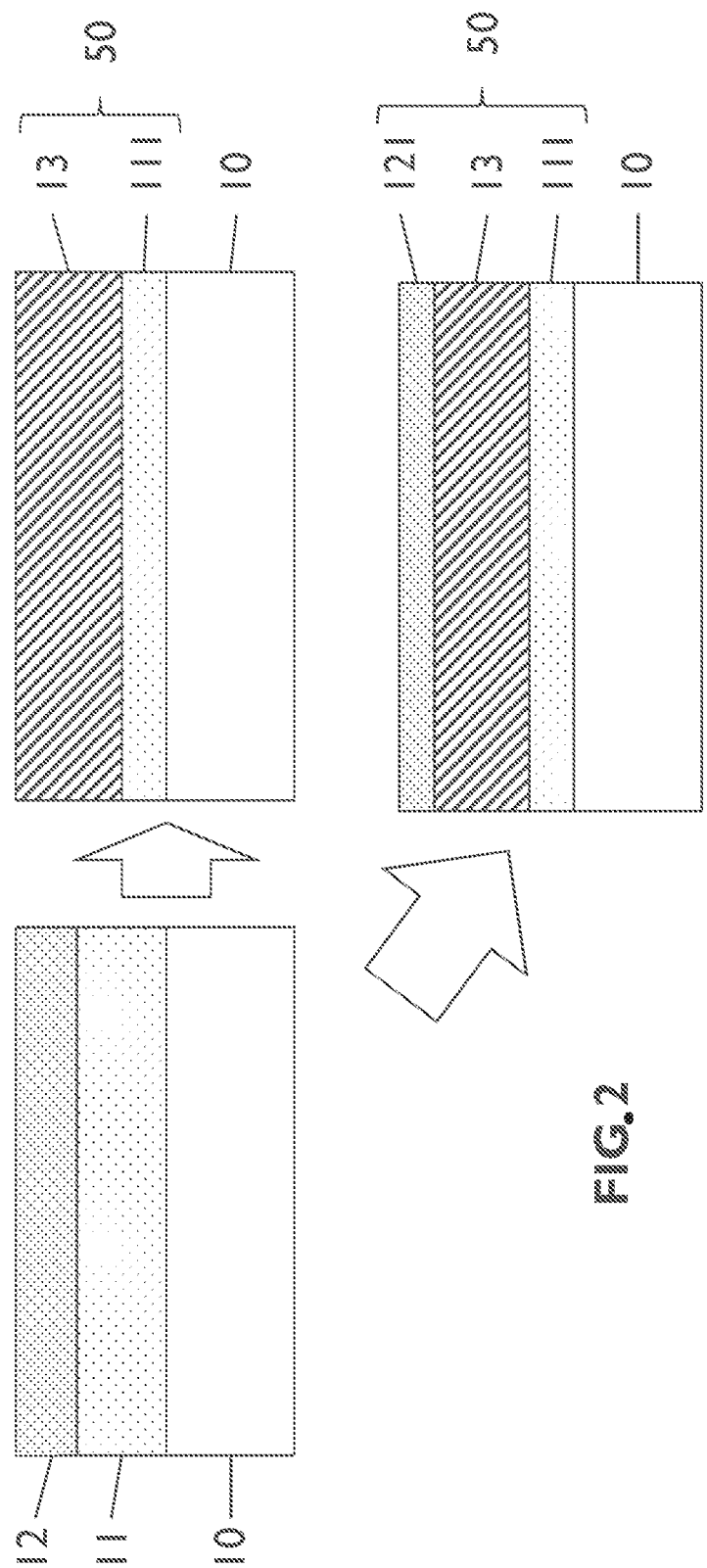
FIG. 2 schematically shows cross sections of layer stacks in different phases, according to an example embodiment.

FIG. 1 schematically illustrates an example of a process flow in accordance with a method of the first aspect of the present disclosure. FIG. 2 schematically shows cross sections of layer stacks in difference phases of examples of a method of the present disclosure.

As illustrated in the examples shown in FIG. 1 and FIG. 2, a method 100 according to the disclosure comprises a step 101 of depositing an initial intrinsic amorphous silicon-containing layer 11 on a surface of a crystalline semiconductor substrate 10, such as a crystalline silicon substrate or a crystalline germanium substrate. The initial intrinsic amorphous silicon-containing layer 11 may be a single layer, or it may be a stack comprising at least two layers, for example, two different layers. The initial intrinsic amorphous silicon-containing layer 11 may comprise an amorphous silicon (a-Si) layer, an amorphous silicon oxide (a-SiO$_x$) layer, a carbon containing amorphous silicon oxide (a-SiO$_x$(C)) layer, a carbon containing amorphous silicon (a-Si(C)) layer, an amorphous silicon carbide (a-SiC$_x$) layer, an amorphous silicon nitride (a-SiN$_x$) layer, an amorphous silicon oxynitride (a-SiO$_x$N$_y$) layer or a combination thereof. It may for example be deposited on the crystalline semiconductor substrate 10 by a Chemical Vapor Deposition (CVD) method, such as Plasma Enhanced CVD, thermal CVD (hot-wire CVD, Low Pressure CVD, reduced pressure CVD or Atmospheric Pressure CVD), or by a Physical Vapor Deposition method, such as sputtering, thermal evaporation or e-beam evaporation. For example, the initial intrinsic amorphous silicon-containing layer 11 is a hydrogenated layer.

A subsequent step 102 comprises depositing a first metal layer 12 on the initial intrinsic amorphous silicon-containing layer 11, for example in direct physical contact with the initial intrinsic amorphous silicon-containing layer. This first metal of the first metal layer 12 is selected to enable the formation of a silicide layer 13 by reaction with the underlying initial intrinsic amorphous silicon-containing layer 11 at a relatively low temperature, for example less than 200° C. The first metal layer 12 may for example comprise a transition metal, a rare earth metal, an alkaline earth metal or a combination thereof. It may for example comprise nickel (Ni), rhodium (Rh), ruthenium (Ru), platinum (Pt), rhenium (Re), palladium (Pd), vanadium (V), cobalt (Co), osmium (Os), tungsten (W), iridium (Ir), ytterbium (Yb), yttrium (Y), gadolinium (Gd), dysprosium (Dy), holmium (Ho), erbium (Er), thulium (Tm), europium (Eu), samarium (Sm), neodymium (Nd), cerium (Ce), lanthanum (La), magnesium (Mg), barium (Ba) and strontium (Sr), or a combination thereof.

The method 100 further comprises performing 104 an annealing process at a temperature between 70° C. and 200° C., thereby inducing a silicidation reaction between at least part of the first metal layer 12 and part of the initial intrinsic amorphous silicon-containing layer 11 and forming a metal silicide layer 13 in electrical contact with the crystalline semiconductor substrate 10. During the annealing process, the first metal layer 12 consumes silicon from the underlying initial intrinsic amorphous silicon-containing layer 11 to form the metal silicide layer 13. The annealing process may for example be done in an inert ambient atmosphere such as a nitrogen atmosphere or an argon atmosphere, in an atmosphere containing nitrogen and hydrogen, in an oxygen containing atmosphere or in air. The duration of the annealing process may for example be in the range between a few seconds to a few hours, for example in the range between 5 minutes and 1 hour.

In a method of the present disclosure, only a part of the initial intrinsic amorphous silicon-containing layer 11 reacts with the first metal layer 12, such that another part (remaining part 111) of the intrinsic amorphous silicon layer 11 remains in between the crystalline semiconductor substrate 10 and the metal silicide layer 13 after having performed the annealing process. This remaining part 111 of the intrinsic amorphous silicon-containing layer may function as a passivation layer 111 for the underlying crystalline semiconductor substrate 10. The initial intrinsic amorphous silicon-containing layer 11 thus has at least two functions: it is a source of silicon for the silicidation reaction and it forms a passivation layer 111 underneath the silicide layer 13.

The metal of the first metal layer 12 may either be fully consumed in the reaction with the initial intrinsic amorphous silicon-containing layer (i.e. all the metal of the first metal layer 12 may be used to form the metal silicide layer 13), or it may be only partially consumed in the reaction with the initial intrinsic amorphous silicon-containing layer 11. In the latter case, a (thinner) first metal layer (remaining part 121) remains on the metal silicide layer 13 after having performed the annealing (silicidation) process. Both embodiments are schematically illustrated in FIG. 2.

As illustrated in FIG. 2, after having performed the annealing process, a passivating electrical contact 50 comprising a stack of an intrinsic amorphous silicon-containing layer (remaining part 111 of the initial intrinsic amorphous silicon-containing layer 11) and a silicide layer 13 is obtained. The passivating electrical contact 50 may further comprise a remaining part of the first metal layer 121 on the silicide layer 13.

Optionally, as indicated in FIG. 1, the method 100 may comprise depositing 103 at least one second metal layer 14 above the first metal layer before performing 104 the annealing process. This second metal layer is used as a capping layer for the first metal layer and may help avoid undesired oxidation reactions during the annealing process. Such undesired oxidation may for example result from an oxidation reaction between the first metal layer 12 and the annealing environment used during the annealing process, especially when such an annealing process is performed in an oxygen containing atmosphere. In embodiments wherein the annealing process is performed in a non-oxidizing atmosphere such as for example in a nitrogen atmosphere or in an argon atmosphere, there may be no need for providing a second metal layer over the first metal layer before performing the annealing step. However, as described above, an additional metal layer may be provided, either before or after the annealing step, for example to improve the electrical conductivity of an electrode formed at the contact and/or to facilitate electrical (inter)connections.

In embodiments of a method 100 of the present disclosure, the first metal layer 12 may be selected to form a metal silicide layer 13 that induces an inversion region in the underlying crystalline semiconductor substrate. In such embodiments the method for forming the passivating electrical contact simultaneously forms a p-n junction in the underlying semiconductor substrate without the need for performing additional steps, e.g. without the need for performing a dopant diffusion step, an implantation step, or an epitaxial deposition process.

In a method 100 of the present disclosure, the first metal layer 12 may be selected to form a metal silicide layer 13 that induces an accumulation region in the underlying crystalline semiconductor substrate. In such embodiments the method for forming the passivating electrical contact simultaneously forms a high/low junction in the underlying semiconductor substrate (i.e. an n+/n junction if the semiconductor substrate is an n-type substrate or a p+/p junction if the semiconductor substrate is a p-type substrate), without the need for performing additional steps, e.g. without the need for performing a dopant diffusion step, an implantation step, or an epitaxial deposition process.

The method for forming a passivating electrical contact on a crystalline semiconductor substrate may for example be used for the formation of passivating electrical contacts in a fabrication process for photovoltaic cells, for example for crystalline silicon photovoltaic cells.

Examples are provided herein below, which illustrate experiments in which a method according to embodiments of the present disclosure was used for forming passivating electrical contacts to a crystalline silicon substrate. These examples are provided for illustrating features and potential advantages of embodiments of the present disclosure, and to aid the skilled person in reducing the disclosure to practice. However, these examples should not be construed as limiting the disclosure in any way.

Figure 3:
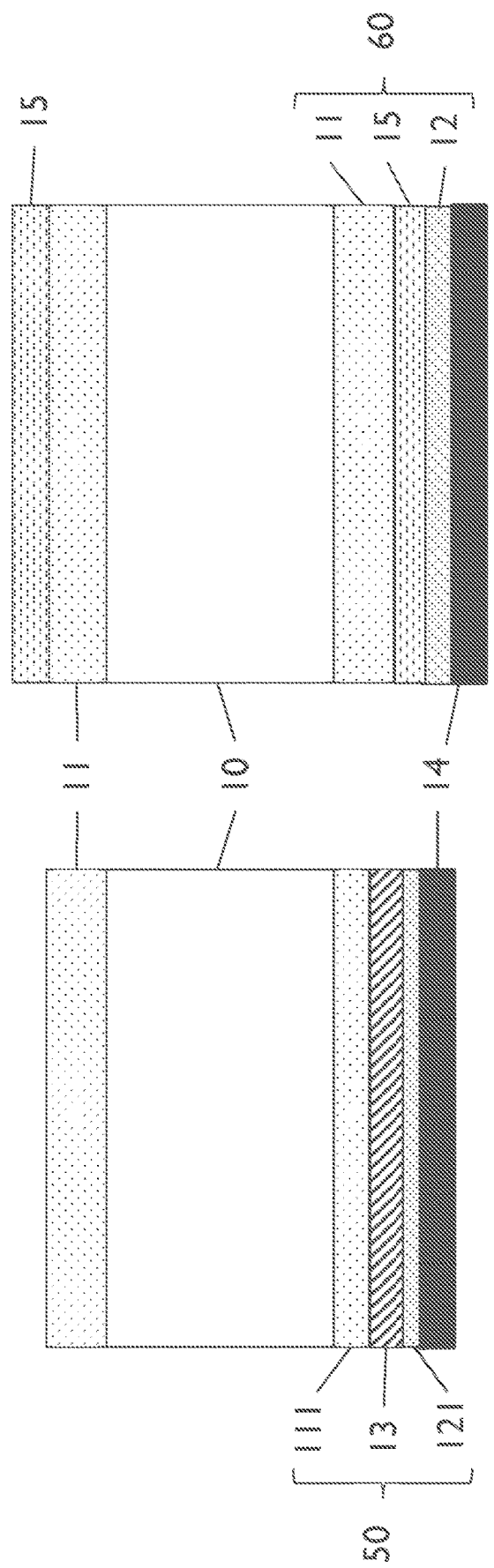
FIG. 3 schematically shows cross sections of test samples (left) and of reference samples (right) used for the determination of the recombination current density underneath passivating electrical contacts, according to an example embodiment.

Test samples having a passivating electrical contact 50 according to an embodiment of the present disclosure were fabricated, using n-type, 170 micrometer thick crystalline silicon Czochralski substrates with a resistivity of 4.1 Ohm·cm. A cross section of the test samples is schematically shown in the left panel of FIG. 3. The substrates 10 were textured randomly at both sides by wet chemical etching (not shown in the left panel of FIG. 3). A 8 nm thick hydrogenated intrinsic amorphous silicon (a-Si:H) layer 11 was deposited on both surfaces (front side and rear side) of the substrate 10 by means of PECVD at 175° C., using $SiH_4$ and $H_2$ as precursors. Next, a 5 nm thick Yb layer 12 (first metal layer) was thermally evaporated on the a-Si:H layer at one side of the substrate, and a 5 nm thick Ag layer 14 (second metal layer) was thermally evaporated on the Yb layer. Next an annealing step was performed at 150° C. for 10 minutes in a nitrogen atmosphere, thereby inducing a silicidation reaction between the Yb layer 12 and the underlying a-Si:H layer 11 and forming an Yb silicide layer 13, resulting in an i-a-Si:H/Yb-silicide/Yb/Ag passivating electrical contact 50 according to an embodiment of the present disclosure.

In addition, reference samples having a known passivating electrical contact structure, more in particular a transition metal oxide based passivating electrical contact 60, were fabricated using n-type, 170 micrometer thick crystalline silicon Czochralski substrates with a resistivity of 4.1 Ohm·cm. A cross section of the reference samples is schematically shown in the right panel of FIG. 3. The substrates 10 were textured randomly at both sides (not shown in the right panel of FIG. 3) by wet chemical etching. A 8 nm thick hydrogenated intrinsic amorphous silicon (a-Si:H) layer 11 was deposited on both surfaces (front side and rear side) of the substrate by means of PECVD at 175° C., using $SiH_4$ and $H_2$ as precursors. A $TiO_x$ layer 15 was deposited on the a-Si:H layers 11 at both sides of the substrate, by thermal ALD (Atomic Layer Deposition) at 225° C., with Tetrakis (dimethylamido)titanium as a Ti precursor and $H_2O$ as an oxidant. Different samples were made with different thicknesses of the $TiO_x$ layer 15, in the range between 0.4 nm and 1.6 nm. A 5 nm thick Yb layer 12 was deposited on the $TiO_x$ layer 15 at one side of the substrate, and a 5 nm thick Ag layer 14 was deposited on the Yb layer 12. Next an annealing step was performed at 150° C. for 10 minutes in a nitrogen atmosphere. This resulted in an i-a-Si:H/$TiO_x$/Yb/Ag passivating electrical contact 60 according to the prior art.

Figure 4:
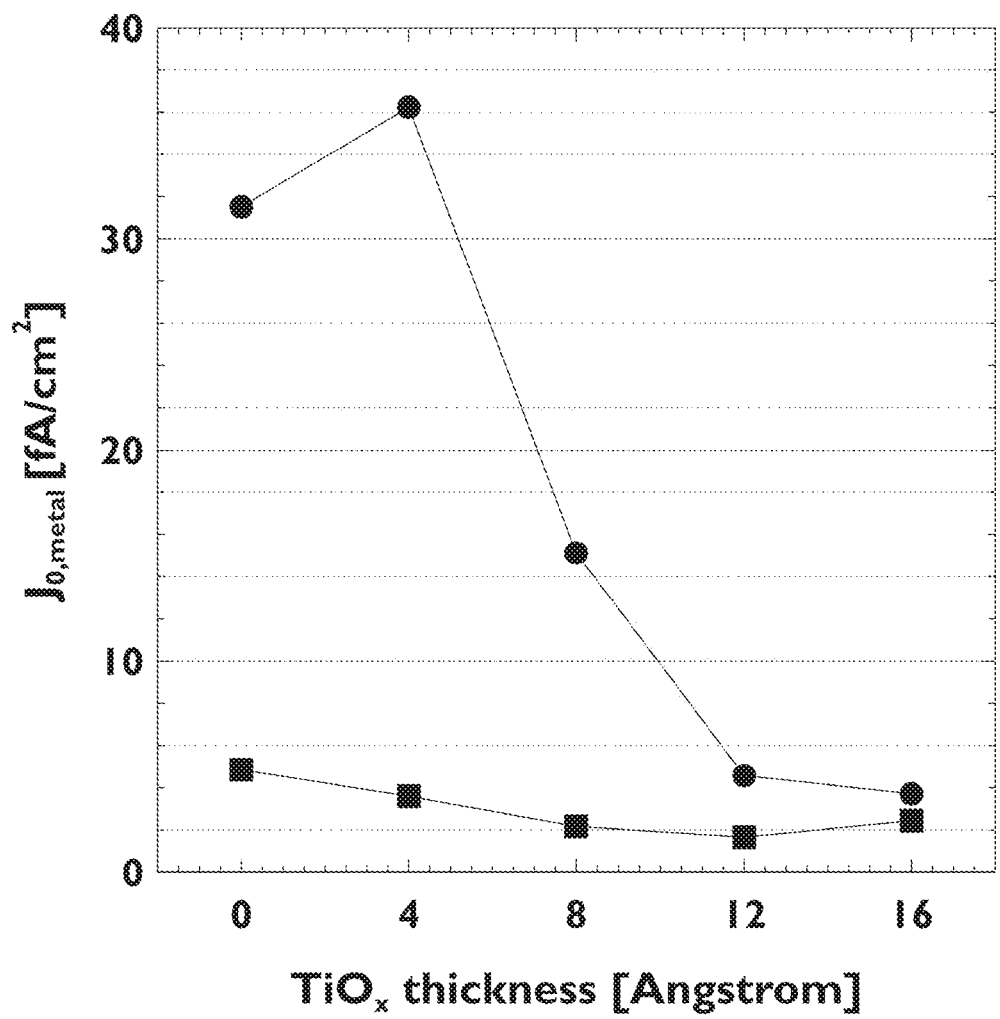
FIG. 4 shows the measured recombination current density underneath a passivating electrical contact, according to an example embodiment.

The recombination current density underneath the passivating electrical contacts ($J_0$, metal) was determined for both the test samples and the reference samples before performing the annealing step and after performing the annealing step. $J_0$,metal was extracted from minority carrier lifetime data measured by means of a QSSPC (Quasi-Steady-State Photoconductance) method. Results of these measurements are shown in FIG. 4. In FIG. 4, the circles represent the measured recombination current density before the annealing step and the squares represent the measured recombination current density after the annealing step. The measurements corresponding to a zero TiO$_x$ thickness represent a passivating electrical contact according to an embodiment of the present disclosure. From the results shown in FIG. 4 it can be concluded that the annealing step results in a significant reduction of the recombination current density underneath the contact for the contact of the present disclosure and for the prior art contacts in the lower range of TiO$_x$ thicknesses. It can be further concluded that, after annealing, a passivating electrical contact structure according to an embodiment of the present disclosure (without TiO$_x$) results in a recombination current density underneath the contact that is in the same order as for prior art contacts with TiO$_x$. This means that a similar passivation quality may be obtained with a passivating electrical contact of the present disclosure as for known passivating electrical contacts, with less process steps.

Figure 5:
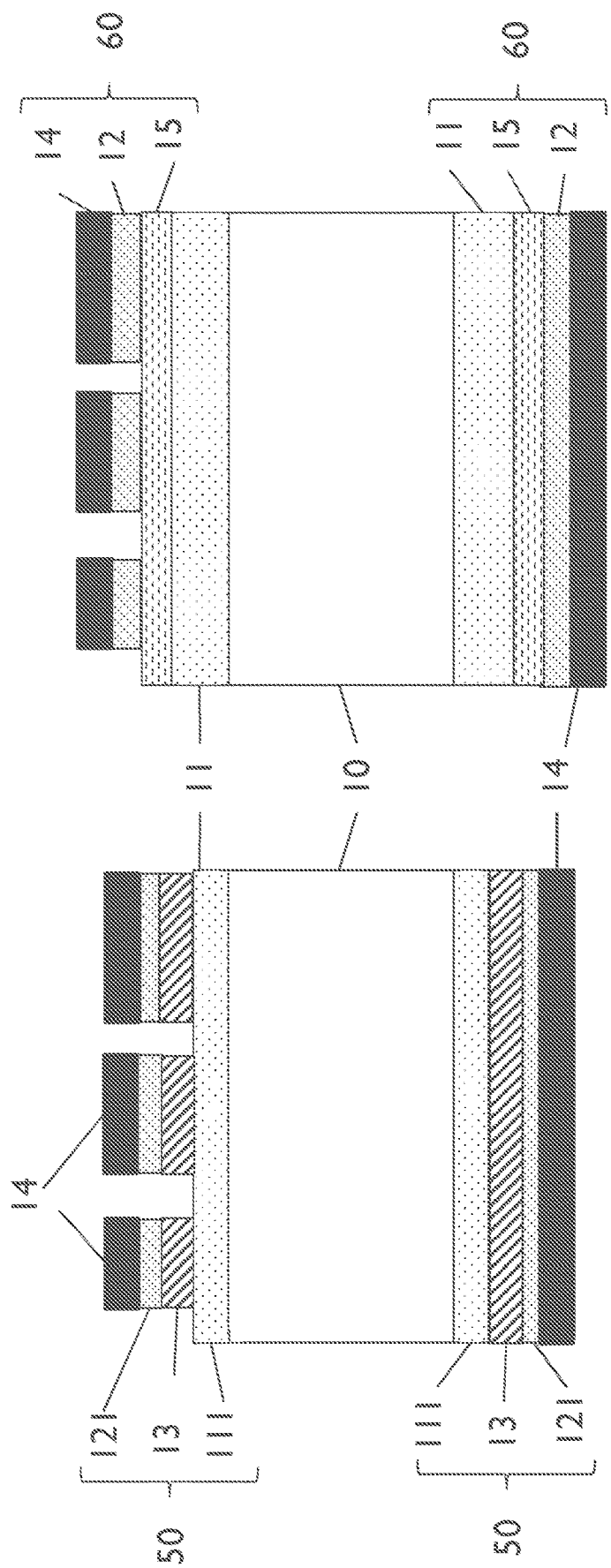
FIG. 5 schematically shows cross sections of test samples (left) and of reference samples (right) used for contact resistivity measurements of passivating electrical contacts, according to an example embodiment.

Additional experiments were performed for analyzing the contact resistivity of passivating electrical contacts of the present disclosure. Test samples having a passivating electrical contact 50 according to an embodiment of the present disclosure were fabricated, using n-type, 170 micrometer thick crystalline silicon Czochralski substrates with a resistivity of 4.1 Ohm·cm. A cross section of the test samples is schematically shown in the left panel of FIG. 5. The substrates 10 were textured randomly at both sides (not shown in the left panel of FIG. 5) by wet chemical etching. A 8 nm thick hydrogenated intrinsic amorphous silicon (a-Si:H) layer 11 was deposited on both surfaces (front side and rear side) of the substrate 10 by means of PECVD at 175° C., using SiH$_4$ and H$_2$ as precursors. A 50 nm thick Yb layer 12 (first metal layer) was thermally evaporated on the a-Si:H layers 11, and a 100 nm thick Ag layer 14 (second metal layer) was thermally evaporated on the Yb layers 12. At one side of the substrate, the Yb layer 12 and the Ag layer 14 were patterned by using a metal shadow mask during thermal evaporation of the metals. A pattern consisting of circular contact areas with different diameters in the range between 250 micrometers and 2000 micrometers was used. Metallized contact areas of different sizes were thereby formed at one side of the test samples. Based on the measurement of the contact resistance for these differently sized contacts the contact resistivity was extracted. After metal evaporation an annealing step was performed at 150° C. for 10 minutes in a nitrogen atmosphere, thereby inducing a silicidation reaction between the Yb layers 12 and the underlying a-Si:H layers 11 and forming Yb silicide layers 13. This resulted in i-a-Si:H/Yb-silicide/Yb/Ag passivating electrical contacts 50 according to an embodiment of the present disclosure In addition, reference samples having a known passivating electrical contact structure, more in particular a transition metal oxide based passivating electrical contact 60, were fabricated using n-type, 170 micrometer thick crystalline silicon Czochralski substrates with a resistivity of 4.1 Ohm·cm. A cross section of the reference samples is schematically shown in the right panel of FIG. 5. The substrates 10 were textured randomly at both sides (not shown in the right panel of FIG. 5) by wet chemical etching. A 8 nm thick hydrogenated intrinsic amorphous silicon (a-Si:H) layer 11 was deposited on both surfaces (front side and rear side) of the substrate 10 by means of PECVD at 175° C., using SiH$_4$ and H$_2$ as precursors. A TiO$_x$ layer 15 was deposited on the a-Si:H layers 11 at both sides of the substrate, by thermal ALD at 225° C., with Tetrakis(dimethylamido)titanium as a Ti precursor and H$_2$O as an oxidant. Different samples were made with different thicknesses of the TiO$_x$ layer 15, in the range between 0.4 nm and 1.6 nm. A 50 nm thick Yb layer 12 was thermally evaporated on the TiO$_x$ layers 15, and a 100 nm thick Ag layer 14 was thermally evaporated on the Yb layers 12. At one side of the substrate, the Yb layer 12 and the Ag layer 14 were patterned by using a metal shadow mask during thermal evaporation of the metals. A pattern consisting of circular contact areas with different diameters in the range between 250 micrometers and 2000 micrometers was used. Metallized contact areas of different sizes were thereby formed at one side of the test samples. Based on the measurement of the contact resistance for these different contact sizes the contact resistivity was extracted. After metal evaporation an annealing step was performed at 150° C. for 10 minutes in a nitrogen atmosphere. This resulted in i-a-Si:H/TiO$_x$/Yb/Ag passivating electrical contacts 60 according to the prior art.

Figure 6:
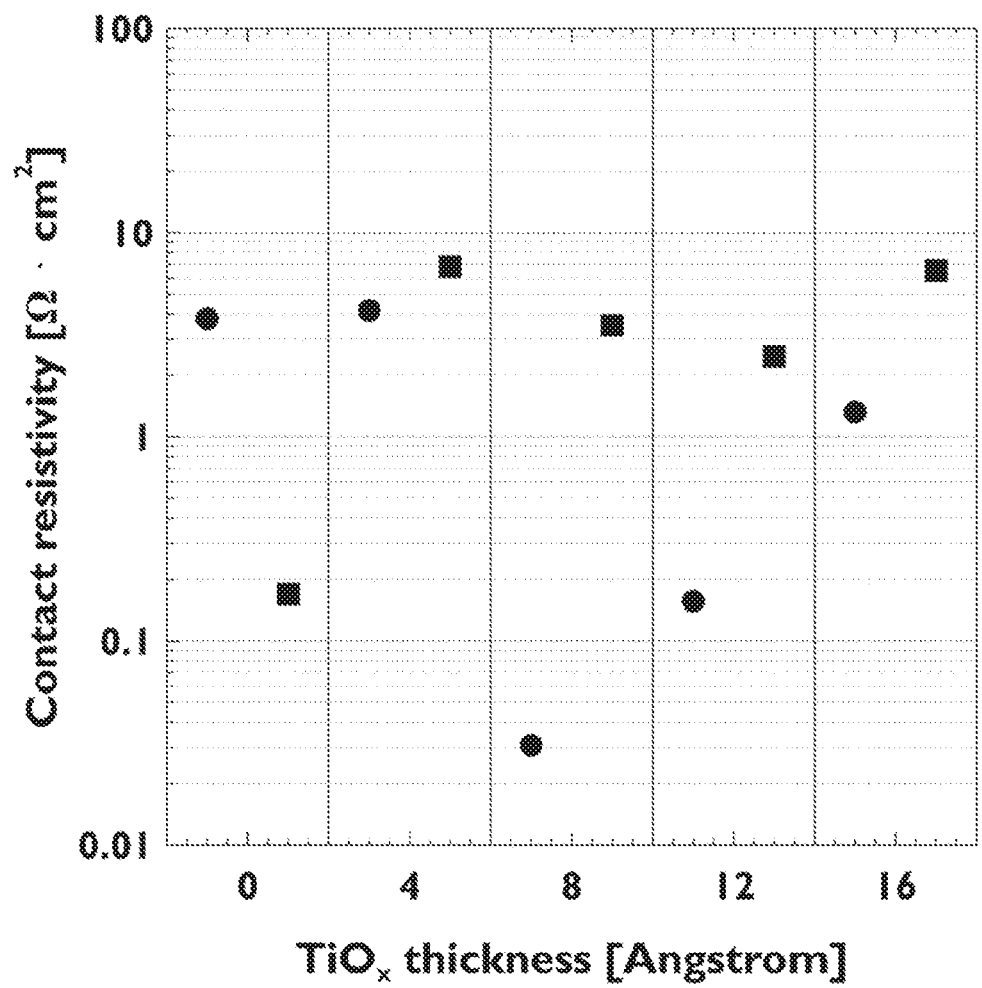
FIG. 6 shows the measured contact resistivity for passivating electrical contacts, according to an example embodiment.

The contact resistivity was determined for both the test samples and the reference samples before performing the annealing step and after performing the annealing step. Results of these measurements are shown in FIG. 6. In FIG. 6, the circles represent the measured contact resistivity before the annealing step and the squares represent the measured contact resistivity after the annealing step. The measurements corresponding to a zero TiO$_x$ thickness represent a passivating electrical contact according to an embodiment of the present disclosure. From the results shown in FIG. 6 it can be concluded that the annealing step results in a significant reduction of the contact resistivity underneath the contact for the contact of the present disclosure. However, for the prior art contacts the annealing step results in an increased contact resistivity. It can be further concluded that, after annealing, the passivating electrical contact of the present disclosure has a substantially lower contact resistivity than the prior art passivating electrical contacts.

In a second aspect, the present disclosure relates to crystalline semiconductor devices comprising at least one passivating electrical contact that may be formed using a method of the first aspect of the disclosure. A crystalline semiconductor device of the present disclosure comprises a crystalline semiconductor substrate and at least one passivating electrical contact on the crystalline semiconductor substrate, wherein the at least one passivating electrical contact comprises a stack of an intrinsic amorphous silicon-containing layer on the crystalline semiconductor substrate and a metal silicide layer on the intrinsic amorphous silicon-containing layer. In some embodiments a first metal layer may be present on top of the metal silicide layer, the first metal layer comprising a same metal as the metal silicide layer. The at least one passivating electrical contact may further comprise a second metal layer above the metal silicide layer, for example on the first metal layer if present or on the metal silicide layer in embodiments without such first metal layer on the silicide layer.

As an example of crystalline semiconductor devices according to embodiments of the present disclosure, photovoltaic cells, more in particular crystalline silicon photovoltaic cells are further described. However, the present disclosure is not limited thereto and other crystalline semiconductor devices may be envisaged, such as for example photodiodes, photosensors or devices for photoelectrochemical water reduction (for hydrogen production).

Examples of different embodiments of crystalline silicon photovoltaic cells of the present disclosure are schematically illustrated in the cross sections of FIG. 7 to FIG. 14.

Different configurations for the passivated contacts may be used. At the front side of the cells the remaining part of the first metal layer 121 and the second metal layer 14 are patterned. The silicide layer 13 may either be patterned, for example according to substantially the same pattern as the metal layers, or it may be non-patterned, i.e. covering the entire front surface. In the latter case the thickness of the silicide layer is for example less than 20 nm to limit optical absorption losses. At the front side, an antireflection coating, for example comprising a dielectric layer, a stack of dielectric layers or a TCO layer, is provided to minimize reflection losses. At the rear side of the cells the remaining part of the first metal layer 121, 122, the second metal layer 14 and the silicide layer 13 may either be patterned or non-patterned. In case of bifacial cells, at the rear side the remaining part of the first metal layer 121, 122 and the second metal layer 14 are patterned. The silicide layer 13 may either be patterned, for example according to substantially the same pattern as the metal layers, or it may be non-patterned, i.e. covering the entire rear surface. In the latter case the thickness of the silicide layer can be less than 20 nm to limit optical absorption losses. An antireflection coating can be provided to minimize reflection losses.

Figure 7:
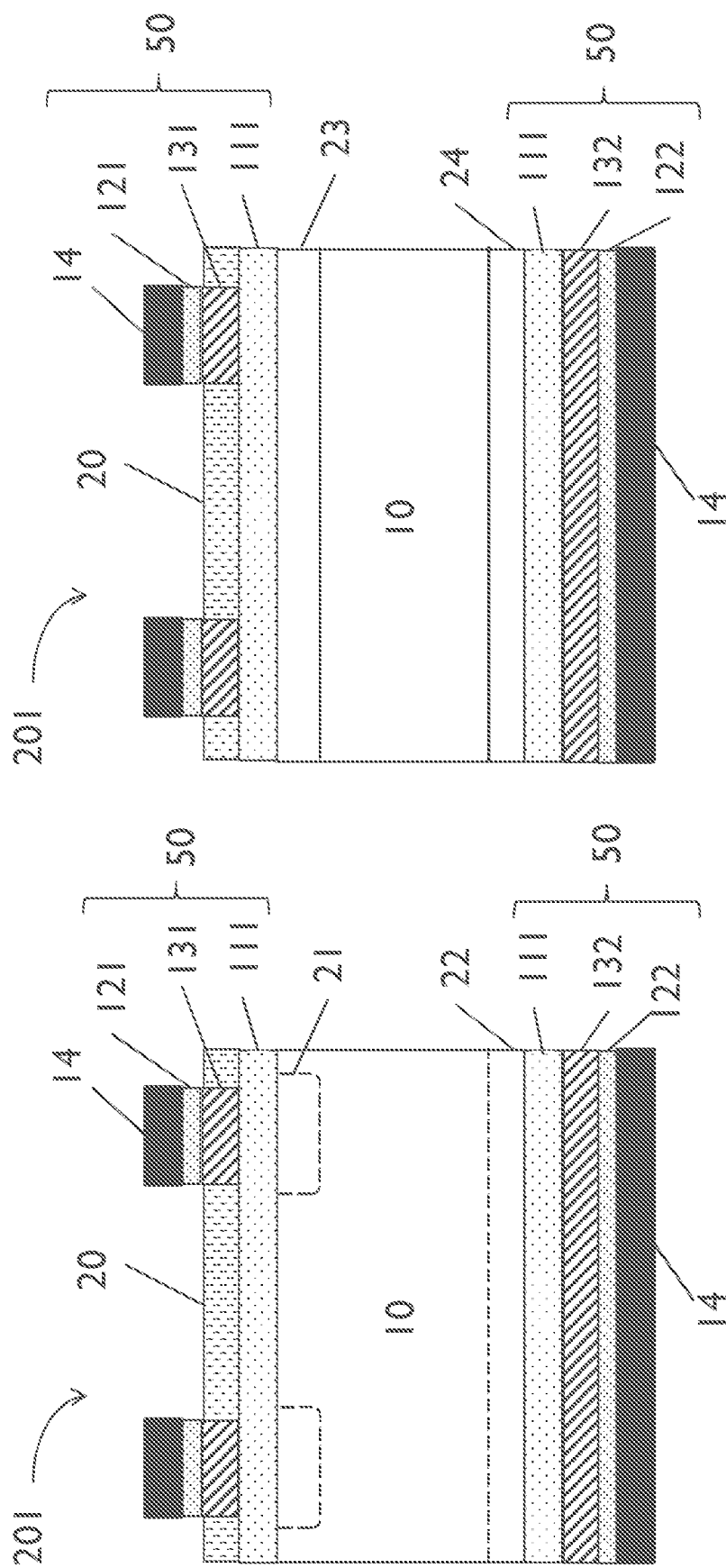
FIG. 7 schematically illustrates examples of different embodiments of crystalline silicon photovoltaic cells, according to an example embodiment.

FIG. 7 illustrates examples of photovoltaic cells 201 of the present disclosure. In the examples shown, the photovoltaic cell 201 has passivating electrical contacts 50 on the front side and on the back side of the cell. The passivating electrical contacts 50 at the front side are patterned (local contacts) and the passivating electrical contacts at the rear side are non-patterned, i.e. they cover the entire rear surface (full area contacts). In the examples shown in FIG. 7, the photovoltaic cell 201 has a crystalline silicon substrate 10 with a front side passivating electrical contact 50 comprising a passivation layer 111 and a patterned first silicide layer 131. A patterned second metal layer 14 is formed above the first silicide layer 131, in the example shown on a remaining part of a first metal layer 121 comprising the same metal as the first silicide layer 131. The first silicide layer 131, the remaining part of the first metal layer 121 and the second metal layer 14 are patterned to form front side electrodes of the photovoltaic cell 201. Further, the photovoltaic cell 201 comprises an antireflection coating 20 at the front side. At the rear side, the photovoltaic cell comprises a passivating electrical contact 50 comprising a passivation layer 111 and a second silicide layer 132 covering the entire rear side of the cell. A second metal layer 14 is formed above the second silicide layer 132, in the example shown on a remaining part of a first metal layer 122 comprising the same metal as the second silicide layer 132. In the example illustrated in the left panel of FIG. 7(*a*), the photovoltaic cell 201 comprises induced junctions. The metal of the first metal silicide layer 131 is selected for inducing an inversion region 21 at the front side of the cell, thereby creating a p-n junction (emitter region) in the substrate 10, as indicated by the dashed lines in the left panel of FIG. 7 delineating the inversion regions 21. The metal of the second metal silicide layer 132 is selected for inducing an accumulation region 22 at the rear side of the cell, thereby creating a high/low junction (Back Surface Field region) in the substrate, as indicated by the dashed line in the left panel of FIG. 7 delineating the accumulation region 22. In the example illustrated in the right panel of FIG. 7, the photovoltaic cell 201 does not comprise induced junctions. Instead it comprises junctions formed by other methods, such as for example epitaxial growth, dopant diffusion or dopant implantation. This is schematically illustrated in the right panel of FIG. 7 by the full lines, delineating a front side doped region (emitter region) 23 and a rear side doped region (Back Surface Field Region) 24.

For the further examples of photovoltaic cells illustrated in FIG. 8 to FIG. 13, all drawings schematically show photovoltaic cells with induced junctions. However, embodiments of the present disclosure are not limited thereto and other types of junctions, such as epitaxial junctions, diffused junctions, or implanted junctions may be used.

Figure 8:
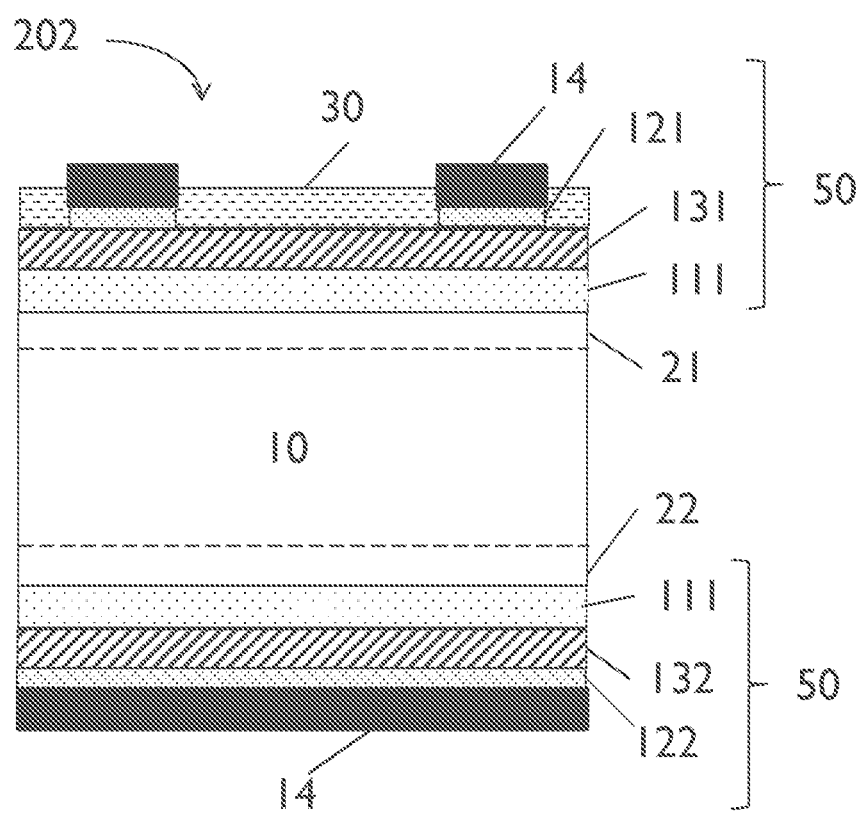
FIG. 8 schematically illustrates examples of different embodiments of crystalline silicon photovoltaic cells, according to an example embodiment.

FIG. 8 illustrates another example of a photovoltaic cell 202 of the present disclosure. In the example shown, the photovoltaic cell 202 has passivating electrical contacts 50 on the front side and on the back side of the cell, the passivating electrical contacts 50 being non-patterned contacts, i.e. comprising a metal silicide layer 131, 132 covering the entire front and rear surface (full area contacts). In the example shown in FIG. 8, the front side passivating electrical contacts 50 comprise a passivating layer 111, a non-patterned first silicide layer 131, a patterned remaining part of a first metal layer 121 and a patterned second metal layer 14. At the front side, the photovoltaic cell 202 comprises an antireflection coating 30. The rear side passivating electrical contacts 50 comprise a passivation layer 111, a non-patterned second silicide layer 132, a non-patterned remaining part of a first metal layer 122, and a non-patterned second metal layer 14.

FIG. 9 to FIG. 12 illustrate examples of bifacial photovoltaic cells comprising passivating electrical contacts in accordance with embodiments of the present disclosure.

In the example illustrated in FIG. 9, the bifacial photovoltaic cell 203 has passivating electrical contacts 50 on the front side and on the back side of the cell, all passivating electrical contacts 50 being patterned contacts, i.e. local contacts. In the example shown in FIG. 9, the front side passivating electrical contacts 50 comprise a passivating layer 111, a patterned first silicide layer 131, a patterned remaining part of a first metal layer 121, and a patterned second metal layer 14. At the front side, the photovoltaic cell 203 comprises an antireflection coating 20. The rear side passivating electrical contacts 50 comprise a passivation layer 111, a patterned second silicide layer 132, a patterned remaining part of a first metal layer 122, and a patterned second metal layer 14. At the rear side, the photovoltaic cell 203 further comprises an antireflection coating 20.

In the example illustrated in FIG. 10, the bifacial photovoltaic cell 204 has passivating electrical contacts 50 on the front side and on the back side of the cell, the passivating electrical contacts 50 at the front side being patterned contacts, i.e. local contacts, and the passivating electrical contacts 50 at the rear side being non-patterned contacts, i.e. full area contacts. In the example shown in FIG. 9, the front side passivating electrical contacts 50 comprise a passivating layer 111, a patterned first silicide layer 131, a patterned remaining part of a first metal layer 121 and a patterned second metal layer 14. At the front side, the photovoltaic cell 203 comprises an antireflection coating 20. The rear side passivating electrical contacts 50 comprise a passivation layer 111, a non-patterned second silicide layer 132, a patterned remaining part of a first metal layer 122, and a patterned second metal layer 14. At the rear side, the photovoltaic cell 203 further comprises an antireflection coating 30.

In the example illustrated in FIG. 11, the bifacial photovoltaic cell 205 has passivating electrical contacts 50 on the front side and on the back side of the cell, the passivating electrical contacts 50 at the front side being non-patterned contacts, i.e. full area contacts, and the passivating electrical contacts 50 at the rear side being patterned contacts, i.e. local contacts. In the example shown in FIG. 11, the front side passivating electrical contacts 50 comprise a passivating layer 111, a non-patterned first silicide layer 131, a patterned remaining part of a first metal layer 121, and a patterned second metal layer 14. At the front side, the photovoltaic cell 205 comprises an antireflection coating 30. The rear side passivating electrical contacts 50 comprise a passivation layer 111, a patterned second silicide layer 132, a patterned remaining part of a first metal layer 122, and a patterned second metal layer 14. At the rear side, the photovoltaic cell 205 further comprises an antireflection coating 20.

In the example illustrated in FIG. 12, the bifacial photovoltaic cell 206 has passivating electrical contacts 50 on the front side and on the back side of the cell, all passivating electrical contacts 50 being non-patterned contacts, i.e. full area contacts. In the example shown in FIG. 12, the front side passivating electrical contacts 50 comprise a passivating layer 111, a non-patterned first silicide layer 131, a patterned remaining part of a first metal layer 121, and a patterned second metal layer 14. At the front side, the photovoltaic cell 206 comprises an antireflection coating 30. The rear side passivating electrical contacts 50 comprise a passivation layer 111, a non-patterned second silicide layer 132, a patterned remaining part of a first metal layer 122, and a patterned second metal layer 14. At the rear side, the photovoltaic cell 206 further comprises an antireflection coating 30.

Figure 13:
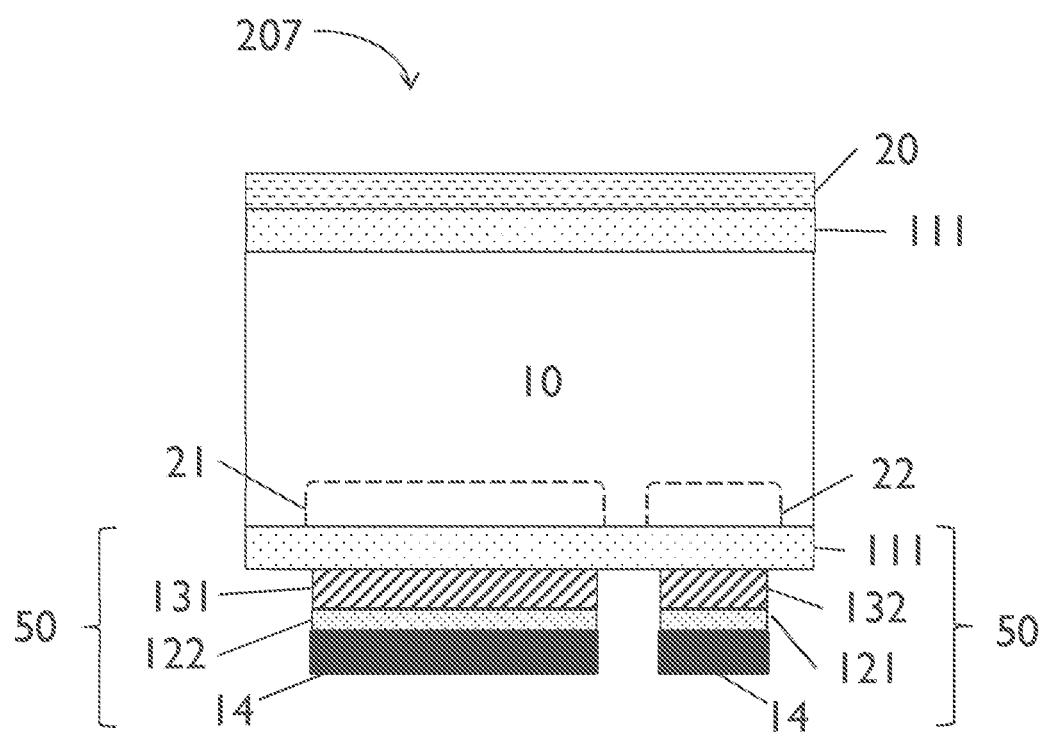
FIG. 13 schematically illustrates examples of different embodiments of crystalline silicon photovoltaic cells, according to an example embodiment.

FIG. 13 illustrates another example of a photovoltaic cell 207 of the present disclosure, more in particular an example of a back-contact cell. In the example shown, the photovoltaic cell 207 has no electrical contacts at the front side and two types of passivating electrical contacts 50 on the back side of the cell, the passivating electrical contacts 50 being patterned contacts, each covering a (complementary) part of the rear surface (local contacts). In the example shown in FIG. 13 the photovoltaic cell 207 has a crystalline silicon substrate 10 with a front side passivation layer 111 and an antireflection coating 20, both covering the entire front side of the cell. At the rear side, the photovoltaic cell 207 comprises a passivation layer 111 covering the entire rear side, a patterned first silicide layer 131 and a patterned second silicide layer 132, the patterned first silicide layer 131 and the patterned second silicide layer 132 being provided at non-overlapping (complementary) locations on the rear surface. In embodiments the pattern of the first silicide layer 131 and the pattern of the second silicide layer 132 may for example be interdigitated patterns. A second metal layer 14 is formed above the first silicide layer 131 and the second silicide layer 132, in the example shown on a remaining part of a first metal layer 121 comprising the same metal as the first silicide layer 131 and on a remaining part of a first metal layer 122 comprising the same metal as the second silicide layer 132, respectively. The first silicide layer 131, the remaining part of the first metal layer 121, and the second metal layer 14 are patterned to form rear side passivating electrical contacts 50 and electrodes of a first type, for example inducing an inversion region 21 underneath the contact. The second silicide layer 132, the remaining part of the first metal layer 122, and the second metal layer 14 are patterned to form rear side passivating electrical contacts 50 and electrodes of a second type, for example inducing an accumulation region 22 underneath the contact. The metal of the first metal silicide layer 131 is selected for inducing (locally) an inversion region 21 at the rear side of the cell, thereby creating a p-n junction (local emitter region) in the substrate 10, as indicated by a dashed line in FIG. 13. The metal of the second metal silicide layer 132 is selected for inducing (locally) an accumulation region 22 at the rear side of the cell, thereby creating a high/low junction (local Back Surface Field region) in the substrate, as indicated by a dashed line in FIG. 13.

Figure 14:
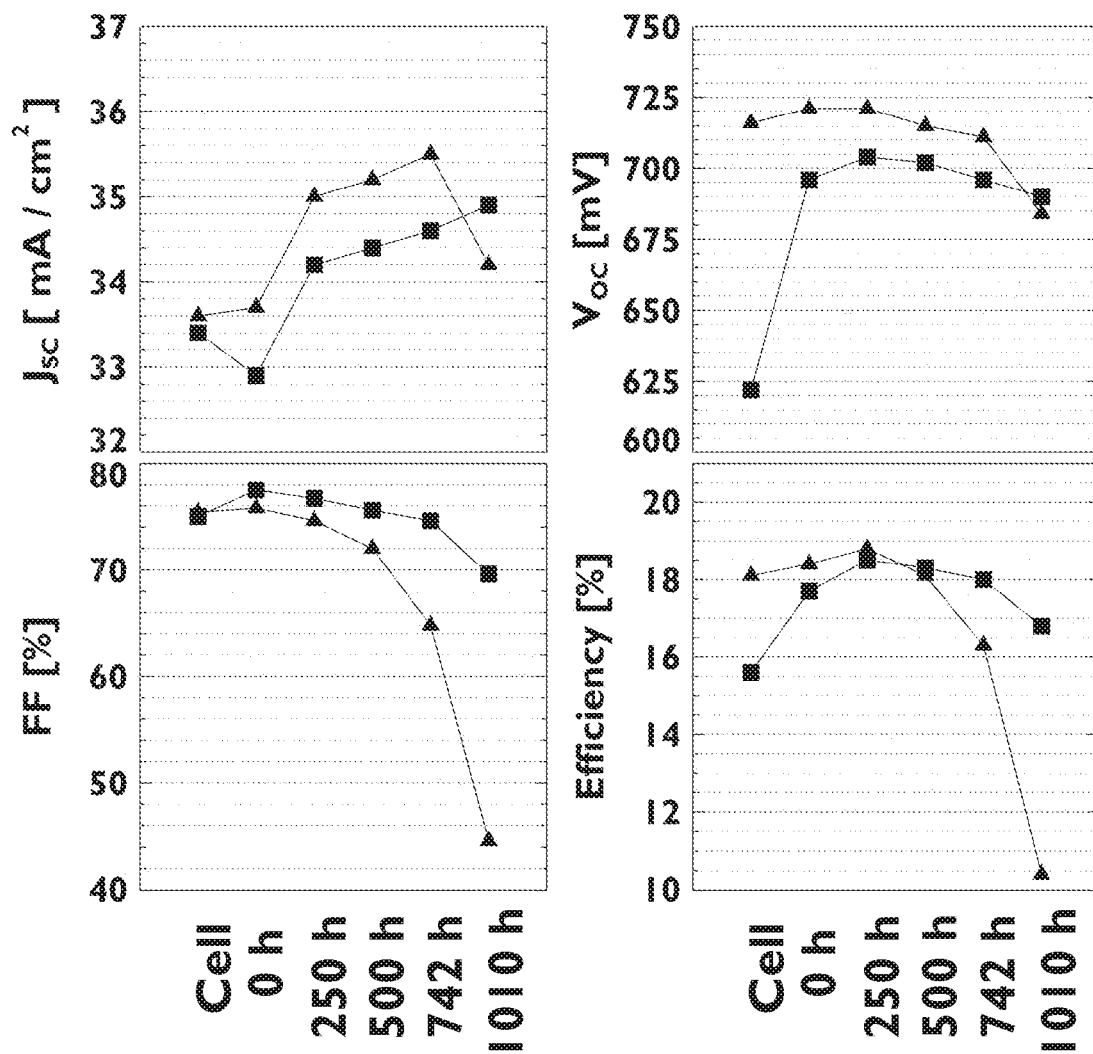
FIG. 14 illustrates the results of IEC61215 damp heat tests (electrical characteristics as a function of time) as performed on single-cell photovoltaic modules comprising cells with passivating electrical contacts, according to an example embodiment.

FIG. 14 shows experimental results obtained from long-term stability tests (IEC 61215 damp heat tests) performed on photovoltaic modules comprising a single photovoltaic cell with passivating electrical contacts.

The long-term stability tests were done on two types of single-cell photovoltaic modules. A first type of module was fabricated with a photovoltaic cell having i-a-Si:H/Yb-silicide/Ag passivating electrical contacts in accordance with an embodiment of the present disclosure. As a reference, a second type of module was fabricated with a photovoltaic cell having i-a-Si:H/TiO$_x$/Yb/Ag passivating electrical contacts according to the prior art. The cell size was 5 cm×5 cm, with an active cell area of 4 cm×4 cm. A UV-blocking ethylene vinyl acetate (EVA) sheet, a smart-wire connection technology (SWCT) foil, ribbons, and glass were used for the encapsulation. A butyl rubber edge seal was applied for hermetic sealing. A lamination process was carried out at 150° C. for about 20 min.

After their fabrication, the photovoltaic modules were stored in a chamber with a controlled humidity of 85% and a controlled temperature of 85° C. The electrical characteristics of the modules under illumination were measured before starting the tests, and at different time intervals during the tests (after 250 hours, after 500 hours, after 742 hours and after 1010 hours). Illuminated current-voltage curves were measured using an AM1.5 solar simulator at 1000 W/m$^2$, 25° C. An aperture area of 4 cm×4 cm was used for these measurements by using an opaque black tape around the edge of the active cell area.

In FIG. 14, squares show the electrical characteristics of a module comprising a photovoltaic cell with passivating electrical contacts according to an embodiment of the present disclosure. Triangles show the electrical characteristics of a module comprising a photovoltaic cell with transition metal oxide based passivating electrical contacts according to the prior art. $J_{sc}$ is the short-circuit current density, $V_{oc}$ is the open-circuit voltage, and FF is the fill factor. The results show a higher stability for the module with a photovoltaic cell according to the present disclosure as compared to the module with a photovoltaic cell according to the prior art. A relative efficiency reduction of 5.3% was observed after 1010 hours for the first type of photovoltaic module, whereas the relative efficiency reduction after 1010 hours was 43.3% for the second type of photovoltaic module.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

It is to be understood that although embodiments, specific constructions and configurations, as well as materials, have been discussed herein for devices according to the present disclosure, various changes or modifications in form and detail may be made without departing from the scope of this

What is claimed is:

1. A method comprising:
   depositing a first layer comprising amorphous silicon on a surface of a substrate;
   depositing a second layer comprising metal on the first layer; and
   performing an annealing process at a temperature within a range of 70° C. to 200° C., thereby inducing a silicidation reaction between the first layer and the second layer and forming a third layer comprising a metal silicide in electrical contact with the substrate, resulting in a remaining part of the first layer being between the substrate and the third layer.

2. The method of claim 1, wherein the amorphous silicon is intrinsic.

3. The method of claim 1, wherein the substrate is crystalline.

4. The method of claim 1, wherein the substrate comprises crystalline silicon.

5. The method according to claim 1, wherein a remaining part of the second layer is on the third layer after forming the third layer.

6. The method according to claim 1, wherein the first layer comprises one or more of amorphous silicon (a-Si), amorphous silicon oxide (a-SiO$_x$), carbon containing amorphous silicon oxide (a-SiO$_x$(C)), carbon containing amorphous silicon (a-Si(C)), amorphous silicon carbide (a-SiC$_x$), amorphous silicon nitride (a-SiN$_x$), or amorphous silicon oxynitride (a-SiO$_x$N$_y$).

7. The method according to claim 1, wherein the second layer comprises one or more of a transition metal, a rare earth metal, or an alkaline earth metal.

8. The method according to claim 1, wherein the second layer comprises one or more of nickel (Ni), rhodium (Rh), ruthenium (Ru), platinum (Pt), rhenium (Re), palladium (Pd), vanadium (V), cobalt (Co), osmium (Os), tungsten (W), iridium (Ir), ytterbium (Yb), yttrium (Y), gadolinium (Gd), dysprosium (Dy), holmium (Ho), erbium (Er), thulium (Tm), europium (Eu), samarium (Sm), neodymium (Nd), cerium (Ce), lanthanum (La), magnesium (Mg), barium (Ba), or strontium (Sr).

9. The method according to claim 1, further comprising depositing an additional layer comprising metal on the second layer before performing the annealing process.

10. The method according to claim 1, wherein forming the metal silicide generates an inversion region in the substrate.

11. The method according to claim 1, wherein forming the metal silicide generates an accumulation region in the substrate.

12. A semiconductor device comprising:
    a semiconductor substrate; and
    a passivating electrical contact on the semiconductor substrate, wherein the passivating electrical contact comprises an intrinsic amorphous silicon-containing layer on the semiconductor substrate and a metal silicide layer in direct contact with the intrinsic amorphous silicon-containing layer.

13. The semiconductor device according to claim 12, wherein the passivating electrical contact further comprises a metal layer on the metal silicide layer.

14. The semiconductor device according to claim 12, wherein the intrinsic amorphous silicon-containing layer comprises one or more of amorphous silicon (a-Si), amorphous silicon oxide (a-SiO$_x$), carbon containing amorphous silicon oxide (a-SiO$_x$(C)), carbon containing amorphous silicon (a-Si(C)), amorphous silicon carbide (a-SiC$_x$), amorphous silicon nitride (a-SiN$_x$), or amorphous silicon oxynitride (a-SiO$_x$N$_y$).

15. The semiconductor device according to claim 12, wherein the metal silicide layer comprises a transition metal, a rare earth metal, or an alkaline earth metal.

16. The semiconductor device according to claim 12, further comprising an inversion region in the semiconductor substrate.

17. The semiconductor device according to claim 12, further comprising an accumulation region in the semiconductor substrate.

18. The semiconductor device according to claim 12, wherein the semiconductor device is a photovoltaic cell.

19. The semiconductor device according to claim 12, wherein the semiconductor substrate is crystalline.

20. The semiconductor device according to claim 12, wherein the semiconductor substrate comprises crystalline silicon.

* * * * *